United States Patent [19]
Cappelletti et al.

[11] Patent Number: 5,604,699
[45] Date of Patent: * Feb. 18, 1997

[54] METHOD OF EVALUATING THE DIELECTRIC LAYER OF NONVOLATILE EPROM, EEPROM AND FLASH-EEPROM MEMORIES

[75] Inventors: Paolo G. Cappelletti, Seveso; Leonardo Ravazzi, Dalmine, both of Italy

[73] Assignee: SGS-Thomson Microelectronics S.r.l., Agrate Brianza, Italy

[*] Notice: The term of this patent shall not extend beyond the expiration date of Pat. No. 5,515,318.

[21] Appl. No.: 454,854

[22] Filed: May 31, 1995

Related U.S. Application Data

[62] Division of Ser. No. 140,628, Oct. 21, 1993.

[30] Foreign Application Priority Data

Oct. 29, 1992 [EP] European Pat. Off. ............. 92830589
Jan. 4, 1993 [EP] European Pat. Off. ............. 93830134

[51] Int. Cl.$^6$ ..................................................... G11C 29/00
[52] U.S. Cl. ............... 365/185.09; 365/182; 365/185.33; 365/189.07; 365/201
[58] Field of Search .................. 365/185.09, 185.33, 365/201, 189.07, 182

[56] References Cited

U.S. PATENT DOCUMENTS

| | | | |
|---|---|---|---|
| 4,779,272 | 10/1988 | Kohda et al. | 371/21 |
| 4,841,482 | 6/1989 | Kreifels et al. | 365/185 |
| 4,963,825 | 10/1990 | Mielke | 324/158 R |
| 5,155,701 | 10/1992 | Komori et al. | 365/182 |
| 5,243,554 | 9/1993 | Allen et al. | 365/185 X |
| 5,247,346 | 9/1993 | Hazani | 365/185 X |
| 5,253,006 | 10/1993 | Tanaka et al. | 365/185 X |
| 5,295,105 | 3/1994 | Atsumi | 365/185 X |
| 5,515,318 | 5/1996 | Cappelletti et al. | 365/185.09 |

FOREIGN PATENT DOCUMENTS

| | | |
|---|---|---|
| 0017808 | 10/1980 | European Pat. Off. . |
| 0306990 | 3/1989 | European Pat. Off. . |
| 3637682 | 5/1987 | Germany . |

*Primary Examiner*—Do Hyun Yoo
*Attorney, Agent, or Firm*—David M. Driscoll; James H. Morris

[57] ABSTRACT

A method employing a test structure identical to the memory array whose gate oxide or interpoly dielectric quality is to be determined, except for the fact that the cells are connected electrically parallel to one another. The test structure is subjected to electrical stress of such a value and polarity as to extract electrons from the floating gate of the defective-gate-oxide or defective-interpoly-dielectric cells and so modify the characteristic of the cell while leaving the charge of the non-defective cells unchanged. In this way, only the threshold of the defective cells is altered. A subthreshold voltage is then applied to the test structure, and the drain current through the cells, which is related to the presence of at least one defective cell in the structure, is measured. Measurement and analysis of the current-voltage characteristic provides for determining the number of defective cells. The method is suitable for in-line quality control of the gate oxide or interpoly dielectric of EPROM, EEPROM and flash-EEPROM memories.

30 Claims, 5 Drawing Sheets

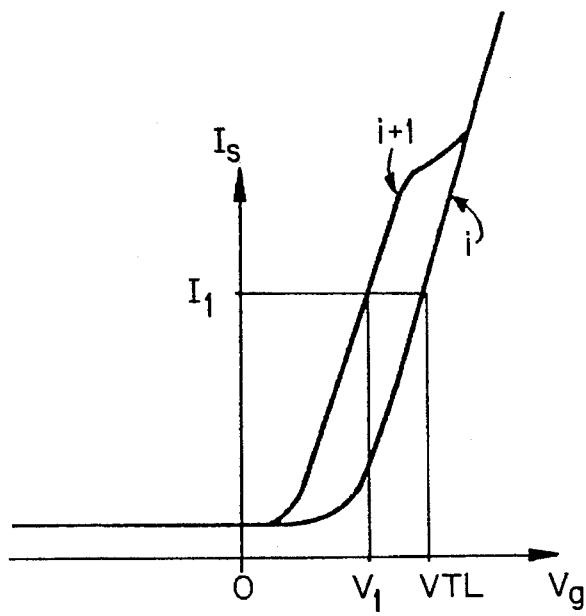
FIG. 6
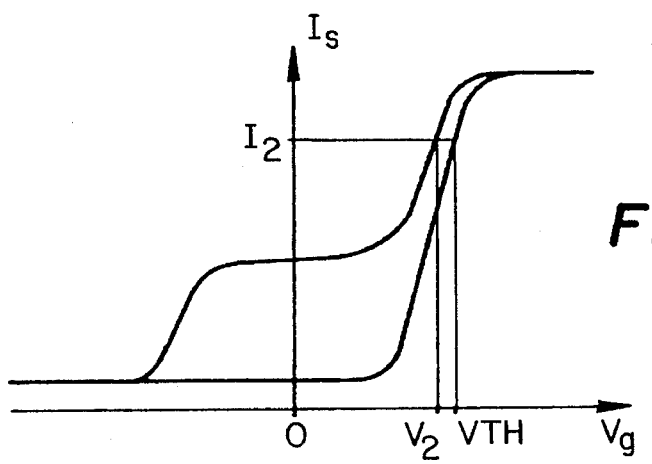
FIG. 7
FIG. 8
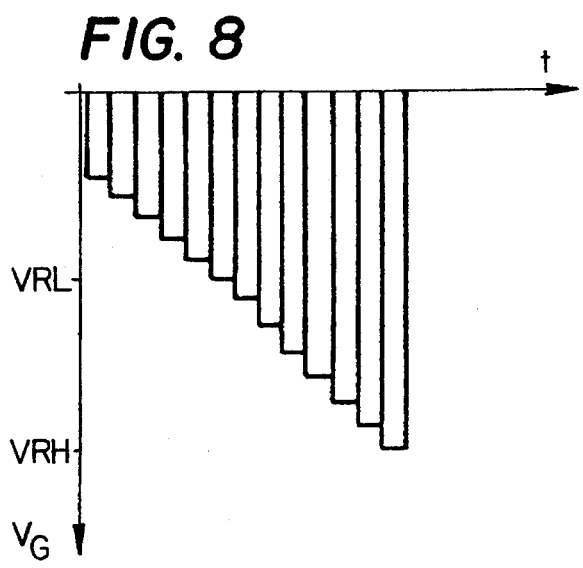
FIG. 9
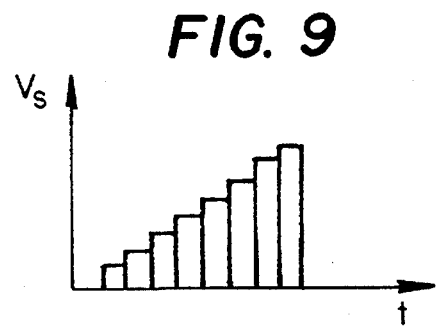

METHOD OF EVALUATING THE DIELECTRIC LAYER OF NONVOLATILE EPROM, EEPROM AND FLASH-EEPROM MEMORIES

This application is a division of application Ser. No. 08/140,628, filed Oct. 21, 1993, entitled METHOD OF EVALUATING THE DIELECTRIC LAYER OF NONVOLATILE EPROM, EEPROM AND FLASH-EEPROM MEMORIES, and now pending.

BACKGROUND OF THE INVENTION

1. Field of the Invention

The present invention relates to a method of evaluating the dielectric layer of nonvolatile EPROM, EEPROM and flash-EEPROM memories.

2. Discussion of the Related Art

The reliability of nonvolatile memories of the aforementioned types is known to depend on the quality of the dielectric layers, which term is intended here to mean both the gate oxide and the dielectric layer interposed between the two polycrystalline silicon layers defining the control gate and floating gate regions and generally referred to as the "interpoly dielectric".

Evaluation of the gate oxide is especially important in the case of flash-EEPROM memories, the cells of which, as shown in the FIG. 1 cross section of a flash-EEPROM cell 100, present a thinner gate oxide layer as compared with those of EPROM memories. More specifically, FIG. 1 shows a P type substrate 1; N type drain and source regions 2 and 3; a gate oxide layer 4; a floating gate region 5; an interpoly dielectric layer 6; a control gate region 7; and a protective oxide layer 8.

The gate oxide layer of flash-EEPROM memories presents a thickness of roughly 110 A (as compared with roughly 200 A for EPROM cells) so as to enable erasure of the flash cells by Fowler-Nordheim tunneling current at voltages leaving the cell itself undamaged. Passage of the tunneling current through the gate oxide, which may be defined as the tunnel oxide by virtue of performing the same functions as the tunnel oxide of EEPROM cells, thus enables electron removal from the floating gate.

In view of its functions, therefore, the flash cell tunnel oxide must be of guaranteed reliability both in terms of resistance to the electrical stress typical of EPROM memories, and in terms of erasure characteristics. Hence, the importance of an effective, reliable method of evaluating the quality of the tunnel oxide.

At present, this is done using tunnel oxide MOS capacitors made specially for the purpose, and wherein the area or perimeter of the capacitors (depending on the side of the cell being considered) is equivalent to that of the arrays used; and the test method itself consists in subjecting the capacitors to voltage or current stress, and evaluating the electric field or total charge at breakdown of the capacitor. At times, the entire current/voltage characteristic obtainable under stress is evaluated.

The above diagnosis and evaluation method, however, presents several drawbacks affecting its precision. To begin with, it has not yet been established beyond all doubt whether a correlation exists between the breakdown charge or electric field values and the presence of defective-oxide cells in arrays manufactured in the same process.

Moreover, not even with the current/voltage characteristics obtained with the above known method is it possible to detect oxide defects when the degree of deficiency of the oxide is such as to affect only some of the cells in the overall array. In fact, the currents responsible for the variation in the threshold of defective-gate-oxide cells, particularly at deficiency levels of a few defects per cm, are rarely measurable, due to the limitation posed by the noise level of the measuring instruments, and the presence at the same time of the gate current of the overall area of the capacitor. This latter factor becomes increasingly more stringent as the deficiency levels for detection get lower, thus requiring the measurement of increasingly higher-area capacitors and so impairing the measuring sensitivity of the method.

Even using known redundancy methods, the presence of even a small number of defective cells may result in failure of the memory. Consequently, as process efficiency and memory reliability depend on the degree of deficiency involved, it is essential that measuring instruments be made available that are capable of detecting even very low deficiency levels.

In the case of new-generation devices, wherein the total area of the interpoly dielectric tends to increase, thus resulting in a reduction in deficiency (expressed in terms of defects per $cm^2$), the quality of the interpoly dielectric also becomes increasingly important.

Current techniques employing straightforward test structures for evaluating the quality of the interpoly dielectric are similar to and present basically the same limitations as the gate oxide techniques, and generally provide for measuring the current-voltage characteristics, and the electric field or charge at breakdown of (large-area or large-perimeter) capacitors with a dielectric identical to the interpoly dielectric. Such a method provides solely for detecting defects with a dominant current/voltage characteristic as compared with that of the overall capacitor, and fails to detect less evident defects which could affect the charge state of nonvolatile memory cells.

More accurate information may be obtained by testing the device itself, which, however, involves a considerable increase in fabrication and test time as compared with straightforward test structures.

It is an object of the present invention to provide a method of detecting defective cells due to poor quality of the gate oxide or interpoly dielectric, and which provides for improved diagnostic performance as compared with known methods and structures currently employed for the purpose.

SUMMARY OF THE INVENTION

According to the present invention, there is provided a method of evaluating the quality of the dielectric layer of nonvolatile EPROM, EEPROM and flash-EEPROM memories, including the steps of connecting in parallel the cells of the memory array, applying to the parallel-connected cells such a stress as to extract electrons from floating gate regions of defective cells of the memory array, and subsequently measuring the characteristic of the parallel-connected cells.

One embodiment of the present invention provides for a test structure identical to the memory array whose dielectric layers (tunnel oxide and/or interpoly dielectric) are to be quality tested; which test structure is so stressed as to only extract electrons from the floating gate of defective-dielectric-layer cells in the structure. In particular, to determine tunnel oxide quality, an electric field is generated from the semiconductor substrate to the control gate; while, for determining the quality of the interpoly dielectric, an electric field is generated in the opposite direction. The test structure is then subjected to a subthreshold voltage; the current through the test structure cells, and which is related to the presence of defective cells, is measured; and the current-voltage characteristic is analyzed for determining the number of defective cells. In this way, it is possible to detect the presence, within the structure, of even only one cell whose gate oxide and/or interpoly dielectric is defective.

BRIEF DESCRIPTION OF THE DRAWINGS

A preferred, non-limiting embodiment of the present invention will be described by way of example with reference to the accompanying drawings, in which:

FIGS. 3 to 7 show electric graphs of the characteristic of the FIG. 2 structure;

FIG. 8 shows the stress voltage applied to the FIG. 2 structure according to one embodiment of the present method for determining the quality of the tunnel oxide;

FIG. 9 shows the stress voltage according to a further embodiment, for determining the quality of the tunnel oxide;

DETAILED DESCRIPTION

Though reference is made in the following description to a flash-EEPROM memory, the present invention may also be applied to EPROM and EEPROM type memories.

Figure 1:
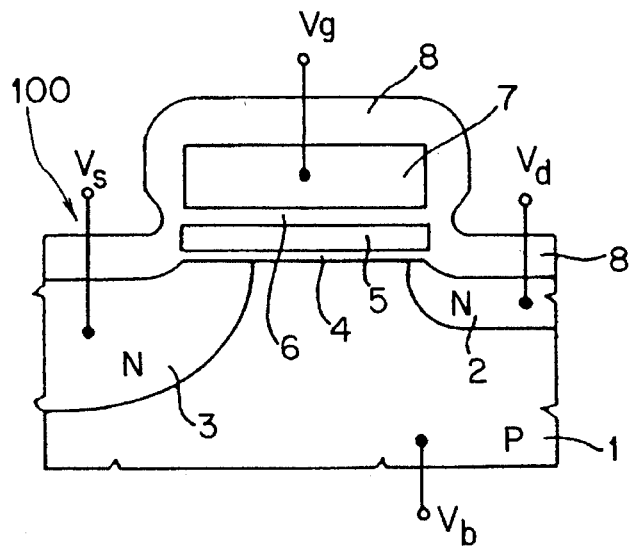
FIG. 1 shows a cross section of a known flash-EEPROM memory cell.
Figure 2:
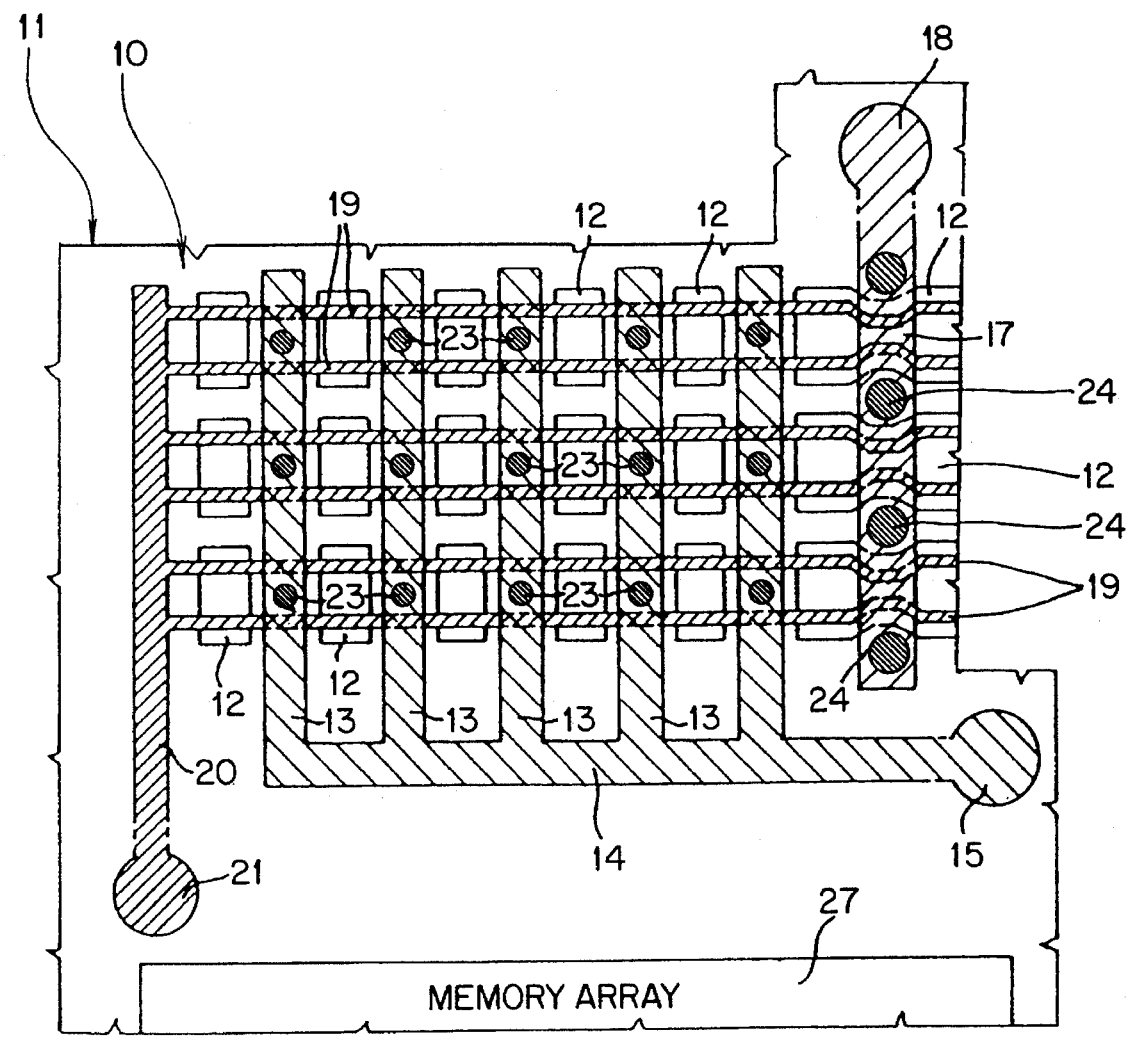
FIG. 2 shows a top plan view of the test structure employed according to the present invention.

FIG. 2 shows a top plan view of a flash-EEPROM memory test structure 10 identical to a standard memory array and therefore presenting a number of cells 100 as shown in FIG. 1. Unlike the standard array, however, and as shown in FIG. 2, the drain regions of cells 100 in structure 10 are all mutually connected by metal lines, as are also the source regions and control gate lines. FIG. 2 shows: part of a wafer 11 of semiconductor material housing field insulating regions 12; metal drain lines 13 connected by a common portion 14 to a single pad 15; metal source line 17 connected to a single pad 18; polysilicon control gate lines 19 connected by a common portion 20 To a single pad 21; drain contacts 23; and source contacts 24. The areas in which field insulating regions 12 are absent and which are not covered by the gate lines constitute the source and drain regions.

Structure 10, which is accessible externally by means of pads 15, 18 and 21, is thus equivalent electrically to the parallel connection of all of cells 100.

Structure 10 may be formed inside the wafer itself and next to the standard memory arrays to be made operative (one of which is shown schematically by 27 in FIG. 2), in which case, structure 10 is fabricated using the same technology and simultaneously with array 27, so as to present the same characteristics (particularly as regards gate oxide and interpoly dielectric quality) and give a reliable indication of the quality of the oxide layers of standard array 27.

Alternatively, for controlling the quality of the gate oxide or interpoly dielectric, structure 10 may be formed on test wafers, in which case, the fabrication process is shortened by eliminating some of the steps required for forming the circuitry annexed to the standard arrays.

For evaluating the quality of the gate oxide, structure 10 is first U.V. erased, so as to render the floating gate of the cells electrically neutral, in which case, the drain current of the structure equals the current of each cell multiplied by the number of cells in the structure. When the structure is stressed electrically in such a manner as to extract electrons from the floating gate of the defective-gate-oxide cells (which thus remains positively charged), and in such a manner as to leave the charge status of The other cells unchanged, the threshold voltage of the defective cells falls, while that of the other (non-defective) cells remains unchanged. Consequently, and particularly if the threshold voltage falls sufficiently (this normally depends on the complexity of structure 10 and is roughly 1 V for one-million-cell structures), for gate voltage values below the threshold voltage of the defective cells, the drain or source current of the defective cells is greater than the total drain current of all the other cells.

Figure 3:
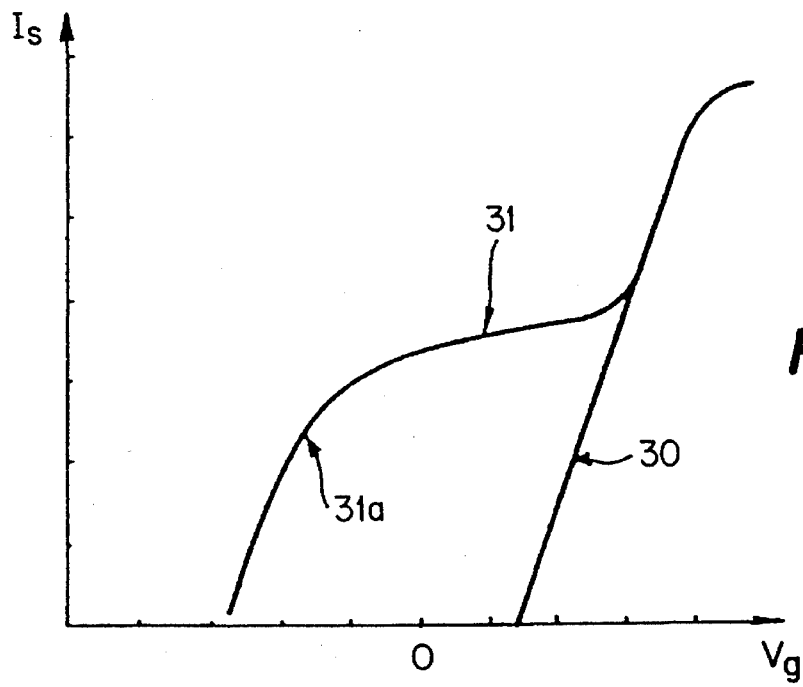

The change in the characteristic of test structure 10 when stressed as described above is shown in FIG. 3, wherein curve 30 shows the source current as a function of gate voltage of a U.V. erased test structure 10, measured in the dark and with a zero gate voltage (VG=0) and a current leakage of less than 1 nA. In general, source leakage, determined solely by the photocurrent generated in the space charge region of the overall source-substrate junction, is highly dependent on light intensity; and drain leakage is also affected by the in? verse current of the drain-substrate junction, which depends both on the voltage applied to the drain and, closely, on temperature.

On applying a negative voltage to the control gate regions (7 in FIG. 1) or a positive voltage to the source regions (3), the electric field in the gate oxide (or tunnel oxide 4) in the floating gate 5-substrate 1 overlap regions (including source and drain diffusions 3 and 2) or respectively in the floating gate 5-source diffusion 3 overlap regions is directed towards floating gate 5. If the voltages applied are low enough to avoid Fowler-Nordheim tunneling through the potential barrier of the gate oxide of non-defective cells, electrons will only be lost from the floating gate of defective cells with an anomalous gate current at low electric fields (see FIG. 10), to give the structure 10 characteristic indicated by curve 31 in FIG. 3, which presents a "tail" 31a due to the presence of defective cells.

Figure 4:
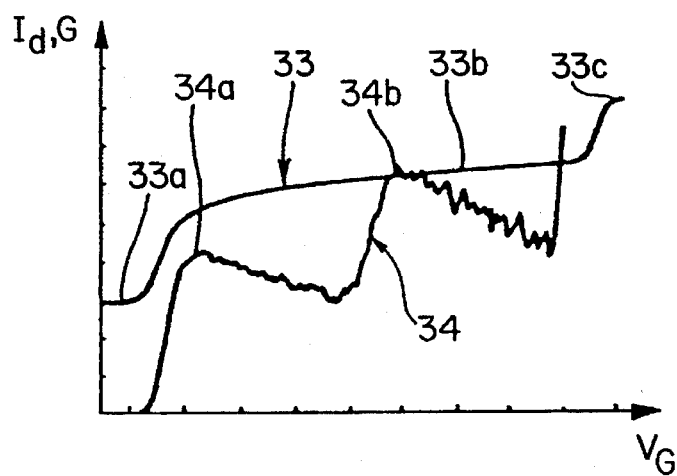

FIG. 4 shows the drain current Id (logarithmic-scale curve 33) and transconductance G (dI/dVG—linear-scale curve 34) of a test structure 10 measured after applying one of the electric stresses described above. More specifically, curve 33 presents a first portion 33a indicating the inverse current of the drain-substrate junction; a second portion 33b indicating the modified portion of the characteristic due to a change in the threshold voltage of a number of cells; and a final portion 33c due to intervention of the overall array. The transconductance curve 34 presents two "humps" 34a and 34b, each due to the drain current produced by a respective defective-oxide cell being turned on at a voltage below the threshold voltage of the other non-defective cells. The transconductance curve thus provides for determining the number of defective cells, and, in particular, for indicating the presence of even only one defective cell.

Due to the impossibility, however, of devising an automatic, industrial-scale routine based on measurement and evaluation of the transconductance curve, two alternatives have been devised for evaluating the overall array.

According to a first solution, the structure is subjected to stress by a given source or gate voltage for fixed intervals of time; and the gate voltages at a predetermined source current (e.g. 300 nA) are measured before and after stress if the difference in the voltages so measured exceeds a predetermined value, the structure is considered defective.

The above solution, however, poses problems as regards minimizing the stress time, and so enabling detection of defective arrays within an acceptable automated time frame, by virtue of the stress time varying widely according to the anomalous gate current, at low electric fields, of the defective cells.

A second preferred solution, which provides for overcoming the above problem, includes a ramped stress routine whereby the stress voltage is applied in steps, and the array characteristic measured after each stress voltage step. The voltage ramp is practically equivalent to an exponential gate current ramp, so that the source current of the defective cells is detected more rapidly as compared with the previous constant? stress solution.

The following is a description of the second solution with reference to FIGS. 5 to 8. In the example shown, due to the effect on the drain current of drain-substrate contact leakage, in addition to that caused by light intensity, the characteristic is measured using the source current.

To begin with, after U.V. erasing test structure 10, the current leakage of the structure is measured with (FIG. 1) Vd=0.05 V, Vg=Vs=Vb=0 V.; and, if the source leakage exceeds a predetermined threshold (e.g. 100 nA), the structure is not tested further. The same also applies to the drain leakage.

Figure 5:
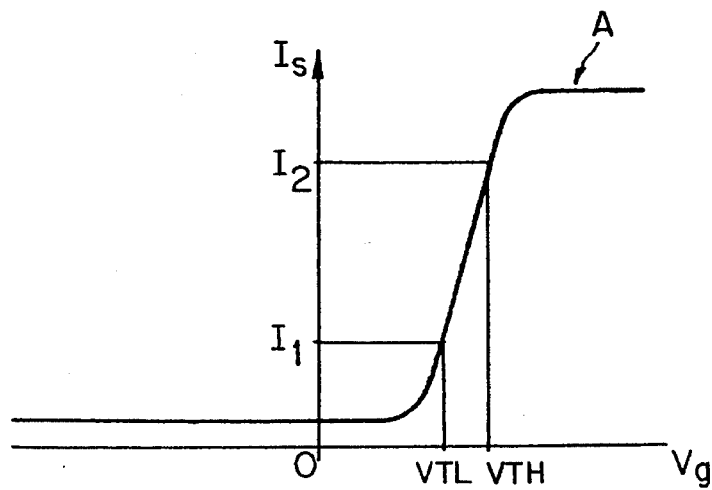

The characteristic of the structure ("virgin" characteristic) is then measured as shown in FIG. 5. More specifically, this phase includes measuring the VTL and VTH values of the gate voltage at two predetermined source current values I1 and I2 (e.g. 200 nA and 1.5 mA), the first affected by the deficiency "tail", and the second representing the intrinsic behavior of the structure, to show the deviation of the characteristic due to the Fowler-Nordheim effect.

The structure is then subjected to a first ramped stress phase, e.g. on the gate, wherein the negative gate voltage (VG in FIG. 8) is increased gradually from, say, −4 V, and in fixed increments of, say, −0.25 V, each stress voltage being maintained for a predetermined time of, say, 0.1 s. After each application of stress voltage VG, value V1 of gate voltage Vg corresponding to source current value I1 (FIG. 5) is measured and compared with the initial value VTL. If the difference (VTL−V1) is less than a predetermined DV value, e.g. 100 mV (normally depending on the accuracy of the instrument), a higher stress voltage, increased as described above, is applied, and the stress and measuring cycle is repeated. Conversely, if VTL−V1 DV, the VG value relative to the stress applied is memorized as VRL, and a second ramped stress phase is performed.

As shown in FIG. 6, VRL (relative to the (i +1)-th stress voltage cycle) indicates the stress responsible for a 0.1 V shift in the characteristic ("tail"), in turn due to a shift in the threshold of one or more defective cells.

As in the first phase, the second stress phase again includes applying linearly-increasing voltage levels, and in measuring the characteristic after each application. More specifically, in the second phase, voltage Vg corresponding to source current value I2 is measured, and the resulting value V2 of gate voltage Vg is compared with the initial value VTH. If VTH−V2<DV, a higher stress voltage is applied. Conversely, the VG value relative to the stress applied is memorized as VRH.

As shown in FIG. 7, VRH indicates the stress responsible for the shift in the characteristic due to a variation in the threshold voltage of the overall array; is related to the intrinsic quality of the cell gate oxide; and depends on the fabrication process parameters and technology.

At this point, the difference between the resulting VRL and VRH values is calculated, and if this exceeds a predetermined threshold (e.g. 1.5 V), the structure is considered defective.

The method may also comprise additional phases for comparing electric parameters and specific characteristic values, and for classifying the structure according to the results.

The entire test sequence may be carried out in a very short time, typically of about 15 sec, and in any case less than few minutes, at at room temperature.

For determining the quality of the interpoly dielectric, the method provides for applying a stress voltage of opposite polarity to that employed for evaluating the gate oxide, and as explained in detail below with reference to FIGS. 10 to 13.

Figure 10:
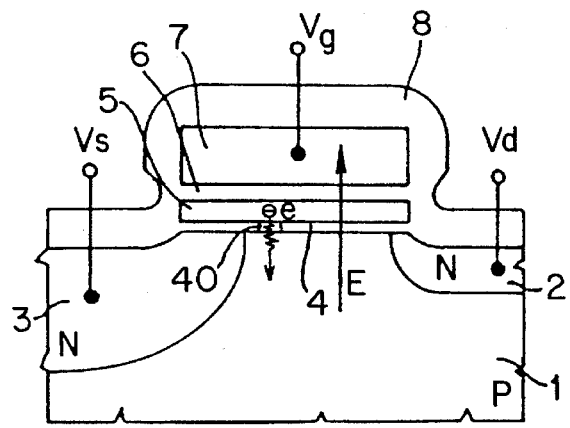
FIGS. 10 to 13 show the same sections as in FIG. 1, illustrating the electrical stress quantities under different deficiency and bias conditions.
Figure 11:
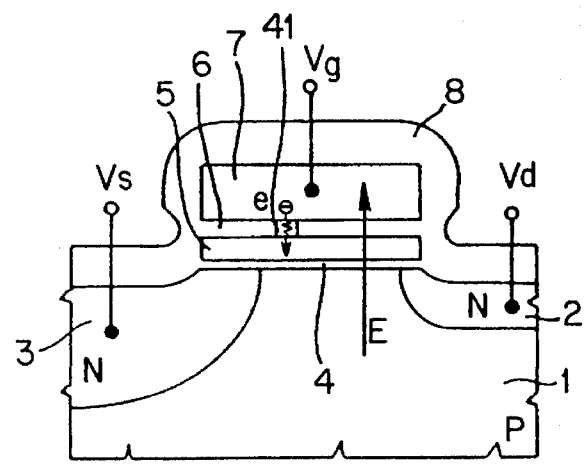

FIGS. 10 and 11 show the direction of the electric field in the case of stress caused by applying a positi? ve voltage to the source region or a negative voltage (in relation to the substrate) to the control gate region. In this case, electric field E, as already shown, is directed towards the floating gate. In the event of a defect in gate oxide 4 (indicated by 40 in FIG. 10), electrons e are extracted from the floating gate towards the substrate or source regions, as indicated in FIG. 10, thus resulting, as already stated, in a change in the transfer characteristic. In the event, however, of a defect in interpoly dielectric 6 (indicated by 41 in FIG. 11), electrons e are injected from control gate 7 to floating gate 5, as indicated in FIG. 11, but with no change in the transfer characteristic (FIG. 5 curve). This is due to the current limitation effected by external series resistance Rs in the linear region of the array (top horizontal portion A of the FIG. 5 curve) where the current of the defective cell would be measurable. Even in the event of zero external resistance Rs, however, the current of the defective cell would be exceeded by that of the overall array (in which case, the cell would be programmed, and would be turned on only after all the other cells in the array have been turned on).

With the above stress, therefore, it is only possible to detect the presence of defective-gate-oxide cells.

Figure 12:
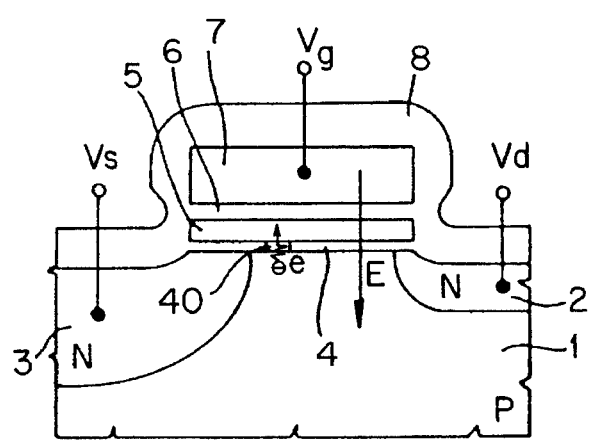

Conversely, on applying a positive voltage to control gate 7 or a negative voltage to substrate 1, the electric field is directed from control gate 7 to substrate 1 (FIGS. 12 and 13), so that, in the event of a defect 40 in gate oxide layer 4, electrons e are injected from the substrate to floating gate 5, as shown in FIG. 12. As stated previously, electron injection into the floating gate produces no change in the characteristic of the array, whereas the presence of defect 41 in interpoly dielectric layer 6 results in electrons e being extracted from floating gate 5 and, consequently, in a change in the characteristic of the array. This type of test therefore provides solely for detecting the presence of cells with a defective interpoly dielectric layer 6.

The quality of interpoly dielectric layer 6 may thus be analyzed using the same routines already described in connection with gate oxide 4, but by simply varying the polarity of the stress voltage applied.

Figure 14:
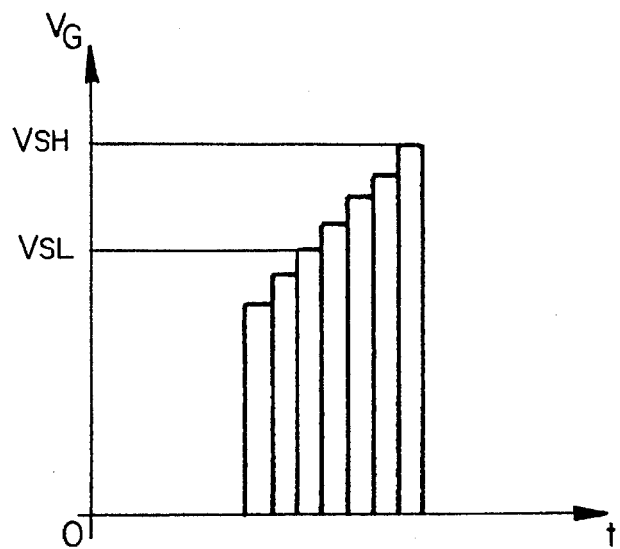
FIGS. 14 to 16 show graphs of the stress voltage and characteristic of the FIG. 2 structure for determining the quality of the interpoly dielectric.
Figure 15:
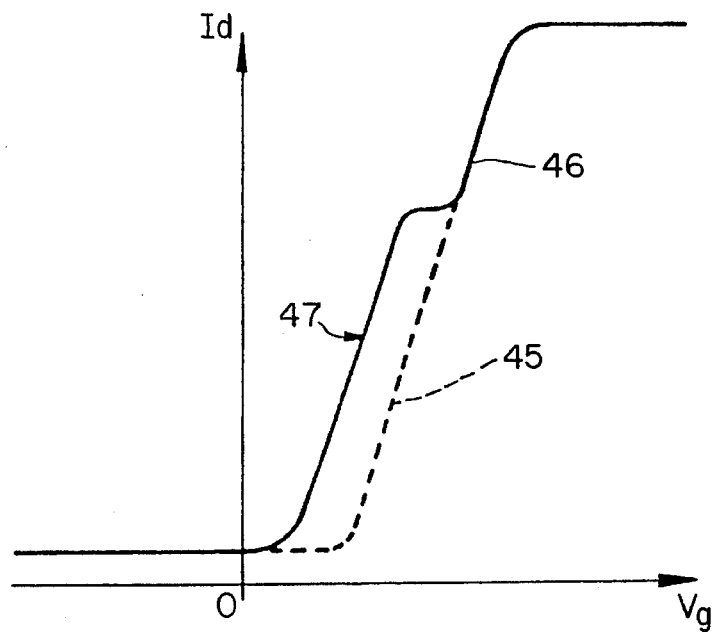

More specifically, after UV erasing test structure 10 and possibly measuring the current leakage, the virgin characteristic (dotted line 45 in FIG. 15) is measured; and, by applying an increasing positive ramp voltage to the control gate terminal (voltage $V_G$ in FIG. 14), the VSL value at which the characteristic of test structure 10 varies by a predetermined amount is determined. The change in the characteristic (due to electron extraction from the floating gate of a cell with a defective interpoly dielectric layer 6, and which is thus turned on at lower gate voltage $V_g$ values) is shown in FIG. 15 wherein curve 46 is translated and presents a "tail" 47. As for the gate oxide test, in this case also, the VSL value at which a 100 mV shift as compared with the virgin characteristic occurs at a predetermined drain current $I_d$ (e.g. 200 nA) may be memorised.

Figure 16:
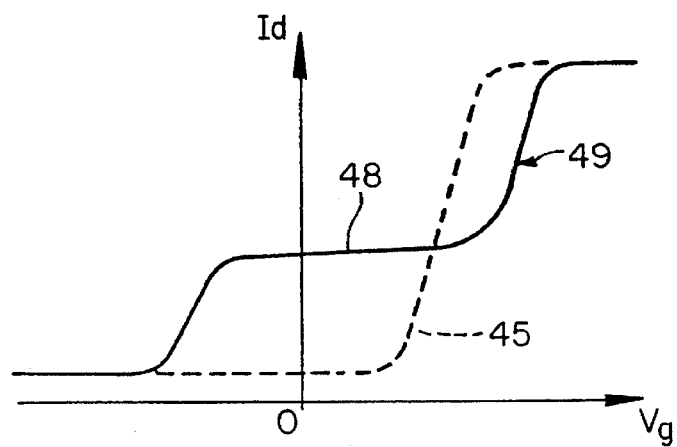

Subsequently, as the ramp voltage increases, the VSH value is determined at which the intrinsic part of the transfer curve is shifted as a result of all the cells in the array being programmed by the electric field applied as a result of Fowler-Nordheim electron injection from the channel regions to the floating gates. In which case, the top portion of the characteristic shifts rightwards towards the high voltage values, as shown in FIG. 16 by portion 49 of curve 48 and the dotted line indicating the virgin curve 45. In this case also, the VSH value at which a shift of 100 mV as compared with the virgin characteristic occurs at a predetermined second drain current $I_d$ (e.g. 1.5 mA) may be memorised.

As for the gate oxide test, the difference DVS=VSH–VSL may be used as a quality parameter of test structure 10. For example, by establishing a reference value $DVS_{ref}$ for comparison with the calculated DVS value, it is possible to calculate the outcome of the test and determine, on the basis of the total area, the deficiency (in defects per $cm_2$) of the dielectric layer in question.

The interpoly dielectric test may be performed before or after the gate oxide test, using the same or a separate test structure identical to that of the gate oxide test.

The advantages of the method and structure according to the present invention will be clear from the foregoing description. Firstly, even if the current through the gate oxide or dielectric layer under stress is less than the noise level of the measuring instruments and therefore not measurable directly, the method and structure according to the present invention provide for indirectly measuring the current through the gate oxide or interpoly dielectric layer via measurement of the drain or source current of the cell, thus enabling detection of even only one defective cell.

This therefore provides for enhanced resolving power as compared with capacitor testing.

As compared with testing the device itself, the method according to the present invention provides for testing at a previous stage, by enabling the selection of lots with defective gate oxide or interpoly dielectric layers at the same test level as capacitors (i.e. immediately following fabrication of the lots).

Moreover, unlike formerly used capacitors, the structural characteristics of which differ widely from those of the memory arrays, the test structure according to the present invention is physically equivalent to the memory arrays, with which it is formed simultaneously and using the same technology, thus enabling a direct evaluation of the quality of the arrays on the basis of the test structure results.

Moreover, the method described is straightforward and easy to implement, and the test structure easy to produce, with no need for special technology or alterations to existing production processes.

Alternatively, for engineering study purposes, test structures with the same physical and structural characteristics as the memory arrays may be produced using a shorter production process, thus enabling fast, effective evaluation of any corrections made to production process specifications.

Figure 13:
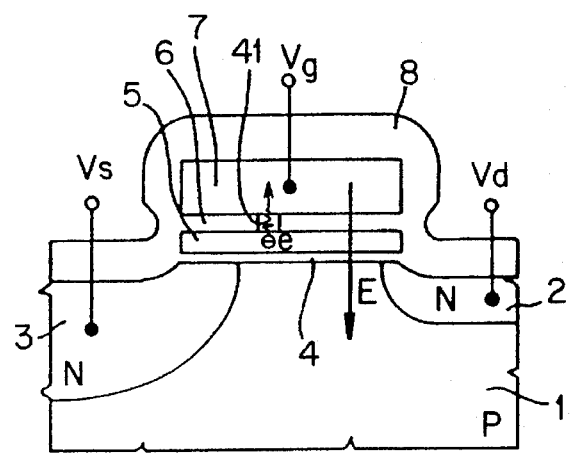

To those skilled in the art it will be clear that changes may be made to the method and structure described and illustrated herein without, however, departing from the scope of the present invention. In particular, for evaluating the gate oxide, stress may be applied indifferently to the gate regions of the test structure cells (as in the embodiment described) or to the source regions, with positive voltages in relation to the substrate (as in FIG. 9), and to the drain regions. For evaluating the interpoly dielectric, on the other hand, the gate regions of the test structure need simply be biased positively in relation to the substrate, so that the direction of the electric field is as shown in FIGS. 12 and 13. Measurement of the current at subthreshold voltage may involve the drain or source current; while measurement of the characteristic may even involve transconductance as opposed to the drain or source currents. Also, stress may be applied differently from the manner described.

Though the above description relates to a flash-EEPROM memory, the method and test structure described may also be employed for evaluating EPROM and EEPROM memories, in which case, the test structure will be physically equivalent to the type of EPROM or EEPROM memory in question, by electrically connecting the control gate, source and drain lines. Finally, the type of stress applied need not necessarily be electrical, e.g. irradiation, providing it results in the removal of electrons from the floating gate of the defective cells.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intending as limiting. The invention is limited only as defined in the following claims and the equivalents thereto.

What is claimed is:

1. A method for evaluating defectiveness of a dielectric layer of an erasable, programmable, READ-ONLY-MEMORY device comprising the steps of:

(a) measuring a characteristic of the device while applying source current, (b) applying stress to the device for a predetermined interval of time, wherein said stress is less than a tunneling stress required to cause Fowler-Nordheim tunneling in a non-defective cell, (c) re-measuring the characteristic of the device while re-applying source current, (d) calculating a result according to the measured characteristic from step (a) and the measured characteristic from step (c), and (e) determining the device is defective if the result is greater than a predetermined threshold.

2. A method as claimed in claim 1 wherein steps (b) and (c) are repeated by applying the stress in discrete increments and re-measuring the characteristic after each stress application.

3. A method as claimed in claim 1 wherein step (a) and step (c) each include the step of measuring at least one of a gate voltage, a gate current, a source current and a drain current.

4. A method as claimed in claim 1 wherein the step of applying a stress in step (b) includes applying a gate voltage to the device.

5. A method as claimed in claim 1 further including the step of erasing the device before step (a).

6. A method as claimed in claim 5 further including, after the step of erasing, the steps of:
   measuring one of a source current leakage and a drain current leakage, and
   determining the device is defective if the measured current leakage is greater than a predetermined threshold.

7. A method as claimed in claim 3 wherein one of step (a) and step (c) includes the step of measuring the gate current, and the gate current is indirectly measured by calculating a difference between the source current and the drain current.

8. A method as claimed in claim 1 wherein the device is one of an EPROM device, an EEPROM device and a flash-EEPROM device.

9. A method as claimed in claim 1 wherein step (d) includes the steps of
   (i) repeating step (b), wherein the device is subjected to a first stress, and step (c) until the difference between the measured characteristic of step (a) and the measured characteristic of step (c) exceeds a first predetermined value;
   (ii) recording a first parameter of the device;
   (iii) repeating step (b), wherein the device is subjected to a second stress, and step (c) until the difference between the measured characteristic of step (a) and the measured characteristic of step (c) exceeds a second predetermined value;
   (iv) recording a second parameter of the device; and
   (v) setting the result equal to the difference between the first parameter and the second parameter.

10. A method as claimed in claim 1, wherein said device includes an array of memory cells, and said method further comprising, prior to step (a), the step of connecting the cells of the array in parallel.

11. An apparatus for evaluating defectiveness of a dielectric layer of an erasable, programmable, READ-ONLY-MEMORY device comprising:
    means for measuring a characteristic of the device while applying source current;
    means for applying stress to the device for a predetermined interval of time, wherein said stress is less than a tunneling stress required to cause Fowler-Nordheim tunneling in a non-defective cell;
    means for re-measuring the characteristic of the device while re-applying source current;
    means for calculating a result according to the measured characteristic from the means for measuring, and the measured characteristic from the means for re-measuring; and
    means for determining the device is defective if the result is greater than a predetermined threshold.

12. An apparatus as claimed in claim 11 further including means for repeatedly cycling the means for applying a stress and the means for re-measuring the characteristic after each stress application wherein the stress is one of a plurality of discrete values.

13. An apparatus as claimed in claim 11 wherein the measured characteristics of the device includes at least one of a gate voltage, a gate current, a source current and a drain current.

14. An apparatus as claimed in claim 11 wherein the stress applied to the device is a gate voltage.

15. An apparatus as claimed in claim 11 further including means for erasing the device.

16. An apparatus as claimed in claim 15 further including
    means for measuring one of a source current leakage and a drain current leakage, and
    means for determining the device as defective if the measured current leakage is greater than a predetermined threshold.

17. An apparatus as claimed in claim 13 further including means for calculating the gate current by calculating a difference between the source current and the drain current.

18. An apparatus as claimed in claim 11 wherein the device is one of an EPROM device, an EEPROM device and a flash-EEPROM device.

19. An apparatus as claimed in claim 11 wherein the means for calculating includes
    means for repeatedly operating the means for applying stress, wherein the device is subjected to a first stress, and the means for re-measuring until the difference between the measured characteristic and the re-measured characteristic exceeds a first predetermined value;
    means for recording a first parameter of the device;
    means for repeatedly operating the means for applying stress, wherein the device is subjected to a second stress, and the means for re-measuring until the difference between the measured characteristic and the re-measured characteristic exceeds a second predetermined value;
    means for recording a second parameter of the device; and
    means for setting the result equal to the difference between the first parameter and the second parameter.

20. An apparatus as claimed in claim 11, wherein said device includes an array of memory cells, and said apparatus further comprises means for connecting said memory cells in parallel.

21. A method for evaluating defectiveness of a dielectric layer of an erasable, programmable, READ-ONLY-MEMORY device, the method comprising the steps of:
    (a) measuring a characteristic of the device;
    (b) after step (a), applying stress to the device, wherein said stress is less than a tunneling stress required to cause Fowler-Nordheim tunneling in a non-defective cell;
    (c) after step (b), re-measuring the characteristic of the device;
    (d) calculating a result according to the measured characteristic from step (a) and the measured characteristic from step (c); and
    (e) determining whether the device includes a defective cell having a defective dielectric layer based on the calculated result.

22. The method of claim 21, wherein steps (b) and (c) are repeated by applying the stress in discrete increments and re-measuring the characteristic after each stress application.

23. The method of claim 21, wherein step (a) and step (c) each include a step of measuring at least one of a gate voltage, a gate current, a source current and a drain current.

24. The method of claim 21, wherein the step of applying a stress in step (b) includes applying a gate voltage to the device.

25. The method of claim 21, further comprising a step of erasing the device before step (a).

26. The method of claim 25, further comprising, after the step of erasing, the steps of:
    measuring one of a source current leakage and a drain current leakage, and determining the device is defective if the measured current leakage is greater than a predetermined threshold.

27. The method of claim 23, wherein one of step (a) and step (c) includes the step of measuring the gate current, the gate current being indirectly measured by calculating a difference between the source current and the drain current.

28. The method of claim 21 wherein the device is one of an EPROM device, an EEPROM device and a flash-EEPROM device.

29. The method of claim 21, wherein step (d) includes the steps of:
(i) repeating step (b), wherein the device is subjected to a first stress, and step (c) until the difference between the measured characteristic of step (a) and the measured characteristic of step (c) exceeds a first predetermined value;
(ii) recording a first parameter of the device;
(iii) repeating step (b), wherein the device is subjected to a second stress, and step (c) until the difference between the measured characteristic of step (a) and the measured characteristic of step (c) exceeds a second predetermined value;
(iv) recording a second parameter of the device; and
(v) setting the result equal to the difference between the first parameter and the second parameter.

30. The method of claim 21, wherein said device includes an array of memory cells, and wherein the method further comprises, prior to step (a), a step of connecting the cells of the array in parallel.

* * * * *

UNITED STATES PATENT AND TRADEMARK OFFICE
CERTIFICATE OF CORRECTION

PATENT NO. : 5,604,699
DATED : February 18, 1997
INVENTOR(S): Paolo Giuseppe CAPPELLETTI and Leonardo RAVAZZI It is certified that error appears in the above-identified patent and that said Letters Patent is hereby corrected as shown below:

On title page,

At [30] Foreign Application Priority Data

Oct. 29, 1992 [EP] Europe ...................................92830589.5
Apr. 01, 1993 [EP] Europe...................................93830134.8

Signed and Sealed this

Twelfth Day of August, 1997

Attest:

BRUCE LEHMAN

*Attesting Officer*   *Commissioner of Patents and Trademarks*